United States Patent [19]
Ohi et al.

[11] Patent Number: 5,338,699
[45] Date of Patent: Aug. 16, 1994

[54] METHOD OF MAKING A SEMICONDUCTOR INTEGRATED DEVICE HAVING GATE SIDEWALL STRUCTURE

[75] Inventors: Makoto Ohi; Hideaki Arima; Natsuo Ajika; Atsushi Hachisuka; Yasushi Matsui, all of Hyogo, Japan

[73] Assignee: Mitsubishi Denki Kabushiki Kaisha, Tokyo, Japan

[21] Appl. No.: 10,691

[22] Filed: Jan. 29, 1993

Related U.S. Application Data

[62] Division of Ser. No. 692,395, Apr. 25, 1991, Pat. No. 5,233,212.

[30] Foreign Application Priority Data

May 2, 1990 [JP] Japan .................. 2-116271

[51] Int. Cl.$^5$ .................. H01L 21/70; H01L 27/00
[52] U.S. Cl. .................. 437/52; 437/48; 437/919
[58] Field of Search .................. 437/52, 48

[56] References Cited

U.S. PATENT DOCUMENTS

| | | | |
|---|---|---|---|
| 4,894,696 | 1/1990 | Takeda et al. | 437/984 |
| 4,910,566 | 3/1990 | Ema | 357/59 |
| 4,974,040 | 11/1990 | Taguchi et al. | |
| 5,043,298 | 8/1991 | Yamada et al. | 437/52 |
| 5,049,957 | 9/1991 | Inoue et al. | |
| 5,100,828 | 3/1992 | Fujii et al. | 437/52 |

FOREIGN PATENT DOCUMENTS 62-179759  8/1987  Japan .
1-10096   4/1989  Japan .

OTHER PUBLICATIONS

Wakamiya et al., "Novel Stacked Capacitor Cell for 64Mb DRAM", *VLSI Technology Symposium* (1989), pp. 69–70.

Primary Examiner—Olik Chaudhuri
Assistant Examiner—H. Jey Tsai
Attorney, Agent, or Firm—Lowe, Price, LeBlanc & Becker

[57] ABSTRACT

A method of making a semiconductor device including a plurality of gate electrodes (6a, 6b, 6c, 6d) arranged on the surface of a semiconductor substrate (1) with insulating layers (5, 8) covering the top and the side walls of the gate electrodes. The spaces between the opposing side walls of adjacent gate electrodes on the surface of the element isolation region (2) are smaller than twice the thickness of the thinnest insulating layer (8) among the insulating layers of the side walls of the gate electrodes on the surface of the active regions. The space (14) between the gate electrodes on the element isolation region is filled with the insulating isolation layer (8) so that unevenness in the underlying portion on the element isolation region on which the conductive interconnection layer (10) to be formed is reduced, preventing thinning of the conductive interconnection layer and disconnection due to excessive etching of a resist film in patterning the conductive interconnection layer.

5 Claims, 10 Drawing Sheets

METHOD OF MAKING A SEMICONDUCTOR INTEGRATED DEVICE HAVING GATE SIDEWALL STRUCTURE

This application is a divisional application of application Ser. No. 07/692,395, filed Apr. 25, 1991, now U.S. Pat. No. 5,233,212.

BACKGROUND OF THE INVENTION

1. Field of the Invention

The present invention relates generally to semiconductor devices and the manufacturing method thereof, and particularly to a structure of memory cells of a dynamic random access memory (referred to as DRAM hereinafter) and the manufacturing method thereof.

2. Description of the Background Art

The process of forming the memory cells of a conventional DRAM will be partially described by referring to FIGS. 1A to 1D.

An element isolation region 2 for isolating and insulating active regions is formed on the surface of a semiconductor substrate 1, at least the active region of which is of p type, by a so-called LOCOS (LOCal Oxidation of Silicon) method (FIG. 1A).

On the semiconductor substrate 1, sequentially formed are a gate insulating film 3, a polysilicon layer 4 doped with impurities and an insulating layer 5, and those are selectively removed by photolithography and etching to pattern gate electrodes 6a, 6b, 6c and 6d. Then, using the gate electrodes 6a, 6b, 6c and 6d as masks, n type impurity ions are implanted into active regions on the surface of the semiconductor substrate to form low concentrated n type impurity regions 7. An oxide insulating film having a prescribed thickness is deposited on the entire surface of the semiconductor substrate 1, and anisotropic etching is performed thereon to form an insulating layer 8 on the side walls of the gate electrodes 6a, 6b, 6c and 6d. Then, further using the gate electrodes 6a, 6b, 6c and 6d and the insulating layer 8 as masks, n type impurity ions are implanted onto the surface of the semiconductor substrate 1 to form highly concentrated impurity regions 7b and attain a state shown in FIG. 4B. Low concentrated impurity regions 7a and the highly concentrated impurity regions 7b constitute the source/drain regions 7 of an MOS (Metal Oxide Semiconductor) type field effect transistor.

A layer 9 of a metal having a high melting point such as tungsten, molybdenum, and titanium is formed entirely over the semiconductor substrate 1 (FIG. 1C).

The high melting point metal layer 9 is then patterned into a prescribed form to form a conductive interconnection layer 10 directly contacted by one of the source/drain regions 7 (FIG. 1D).

The gate electrodes 6a, 6b, 6c and 6d formed by the above described process constitute word lines of the DRAM memory cell, the conductive interconnection layer 10 forming bit lines.

After the formation of the conductive interconnection layer 10, memory cells are completed through the formation process of lower electrodes (storage nodes), dielectric layers, upper electrodes (cell plates), etc. The tops of the memory cells are schematically shown in FIG. 2. A cross section shown in FIG. 1D is taken along A—A in FIG. 2.

The DRAM memory cells formed undergoing the above process possesses the following problems.

A vertical section of the conductive interconnection layer 10 of the memory cells formed by the above conventional manufacturing process, i.e. a section taken along B—B shown in FIG. 2 is as shown in FIG. 3A. As can be seen from the FIG. 3A, depressions as shown by circles M, N are produced in the high melting point metal layer 9 or the conductive interconnection layer 10, because the gate electrodes 6b, 6c and 6d are widely spaced apart on the element isolation region 2. Such a depression produced in the high melting point metal layer 9 gives rise to the following problem. When patterning the high melting point metal layer to form the conductive interconnection layer 10, as shown in FIG. 3B, after a resist mask 13 is applied thereto, patterning is carried out by photolithography and etching to selectively etch away the high melting point metal layer 9. In the photolithography process of the resist mask 13, exposure is performed focusing at the vicinity of the lower plane of the resist mask 13, i.e. to the plane in the vicinity of the surface of the high melting point metal layer 9 (S plane indicated by chain double dotted line in FIG. 3B). Therefore, the depressions circled by M, N are out of focus of the exposure pattern in the surface of the high melting point metal layer 9, the contrast of the exposure pattern thereon being unclear. In developing the resist 13, the resist mask 13 in the vicinity of these depressions is therefore developed excessively to be thin in these places. Also in the conductive interconnection layer 10 after the high melting point metal layer 9 is selectively etched, thin portions are produced in these depressed portions, as shown in circles M, N in FIG. 3C, accordingly. These thin portions can cause degradation in conductivity in the conductive interconnection layer 10, resulting in defects such as disconnection in the extreme case.

SUMMARY OF THE INVENTION

It is an object of the present invention to provide a semiconductor device without uneven portions in the underlying parts in which a conductive interconnection layer is to be formed on an element isolation region, and the manufacturing method thereof.

A semiconductor device in accordance with the present invention relates to a semiconductor device including a semiconductor substrate having active regions of a first conductivity type, an element isolation region formed on the surface of the semiconductor substrate for isolating and insulating active regions, a plurality of gate electrodes arranged approximately parallel to each other the surface of the semiconductor substrate, impurity diffusion regions of a second conductivity type formed in the vicinity of the surfaces of the active regions with the gate electrodes therebetween, an insulating layer for covering the tops and the side walls of the gate electrodes, and a conductive interconnection layer connected electrically to the impurity diffusion regions and formed approximately perpendicularly to the gate electrodes on the surface of the insulating layer covering the gate electrodes. The semiconductor device is characterized in that the space between the opposing side walls of the gate electrodes on the element isolation region is set to be smaller than the thickness twice as large as the thickness of the thinnest insulating layer of the insulating layers on the side walls of the gate electrodes on the surfaces of the active regions.

The manufacturing method of the semiconductor device in accordance with the present invention includes the following steps: forming an element isolation region for isolating and insulating active regions on the surface of a semiconductor substrate having active regions of a first conductivity type; forming a plurality of gate electrodes arranged parallel to each other on the surface of the semiconductor substrate and having their tops covered with an insulating layer, after the formation of the element isolation region; implanting impurity ions of a second conductivity type onto the surface of the semiconductor substrate, using the gate electrodes as masks, to form low concentrated impurity regions; depositing an insulating film having a prescribed thickness on the entire surface of the semiconductor, substrate after the formation of the gate electrodes; forming an insulating layer having a prescribed thickness on the side walls the gate electrodes within the area of active regions; using the gate electrode and the insulating layer as masks, implanting impurity ions of the second conductivity type onto the surface of the semiconductor substrate to form highly concentrated impurity regions; and patterning a conductive interconnection layer arranged on the semiconductor substrate in a direction approximately perpendicular to the gate electrodes and electrically connected to the highly concentrated impurity regions. The manufacturing method is characterized in that, in the process of forming the gate electrodes, the gate electrodes are patterned so that the space between the opposing side walls of two adjacent gate electrodes in the element isolation region is smaller than the thickness twice as thick as that of said insulating layer formed on the side walls of the gate electrodes in the active regions.

In accordance with the semiconductor device and the manufacturing method of the present invention, in the element isolation region, the space between the opposing side walls of adjacent gate electrodes are formed to be smaller than the thickness twice as thick as that of the insulating layer to be formed on the side walls of the gate electrodes in the active regions, so that the spaces between the gate electrodes on the element isolating region are buried with the insulating layer, thereby reducing difference in level in the underlying portion of the element isolation region, on which the conductive interconnection layer is to be formed, and, therefore, the problems such as the thinning of the conductive interconnection layer and disconnection due to excessive etching of the resist film in patterning the conductive interconnection layer are prevented.

Now, description will be given on the relation of the space between the opposing side walls of adjacent gate electrodes on the element isolation region and the difference in level on the element isolation region in conjunction with the appended drawings.

When depositing an oxide film 23 on the an even portion in the vicinity of the side walls of a gate electrode 22 on an element isolation region 21 by the CVD method, in the uneven portion, both horizontal plane and side plane grow equally in thickness, while in the edge portion, the cross section grows to be in a circular state, because, logically the oxide film 23 is deposited uniformly on the surface of the underlying portion as shown in FIG. 4A. If reactive ion etching which is completely anisotropic only in the vertical direction is applied to the oxide film 23 to form a side wall spacer 24, the width of the film on the surface of the element isolation region 21 is equal to $t_1$ (FIG. 4B).

If two gate electrodes 22a, 22b are closely located, the distance between the side walls is $W_1$, the difference in level (the heights of the gate electrodes 22a and 22b)

being L, the thickness of the oxide film 23 to be deposited is represented by $t_1 < W_1/2$, so that the uneven portion is not buried with the oxide film 23 as shown in FIG. 5A, thereby producing the difference L on the surface of the oxide film 23. If $t_1 = W_1/2$, as shown in FIG. 5B, the uneven portion is just buried with the oxide film 23, and at the time the depth of a depression $\delta$ produced on the surface of the oxide film 23 is approximately equal to $t_1$. If $t_1 > W_1/2$, as shown in FIG. 5C, the oxide film 23 is deposited in a further even state compared to the state shown in FIG. 5, and the depression depth $\delta$ of the surface of the oxide film 23 is $$t_1 - \sqrt{t_1^2 - (W_1/2)^2} .$$

FIG. 6 shows the relation between $t_1$ and $\delta$ graphically by summarizing the above described result.

The above relation is, however, based on a simplified logic assuming that anisotropic etching proceeds only in the vertical direction, and, therefore, in practice, even in case of anisotropic etching, the etching proceeds in the horizontal direction to some extent, thereby causing so-called side etching. The width $W_2$ of the side wall spacer 24 is, therefore, smaller than the thickness $t_1$ of the oxide film 23, as shown in FIG. 7A, being roughly represented by $t_1 = 1.5W_2$. Taking the above relation into account, the oxide film 23 is previously deposited so that the thickness $t_1$ of the oxide film 23 is approximately 1.5 times as large as a desired width $W_2$ of side wall spacer 24. Generally, optimal transistor characteristic can be obtained when the width $W_2$ of the side wall spacer 24 is set to be approximately 0.1 $\mu$m. In this case, the thickness of the oxide film 23 is set to be approximately 0.15 $\mu$m, and a depression having a depth $\delta$ is produced, as shown in FIG. 7B, after anisotropic etching is applied to form the side wall spacer 24. The relation between $W_1$ and $\delta$ varies as shown in FIG. 7C. As can be seen from a graphical representation in FIG. 7C, $\delta$ changes gently within a range of $W_l$ being smaller than point A, i.e. the point where $W_1 = 2W_2$ (=0.2 $\mu$m), while changes drastically within a range represented by $2W_2 < W_1 < 2t_1$, so that the value of $\delta$ increases in accordance with difference in thickness in the plane.

Consequently, it is understood that the relation should satisfy representation $W_1 < 2W_2$.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3C is a top plan view, FIG. 3A being a sectional view taken along C—C in FIG. 3C, FIG. 3B being a sectional view taking along D—D in FIG. 3C;

DESCRIPTION OF THE PREFERRED EMBODIMENTS

One embodiment in accordance with the present invention will be described in conjunction with FIGS. 8A to 8C and FIGS. 9A to 9I.

Figure 9A:
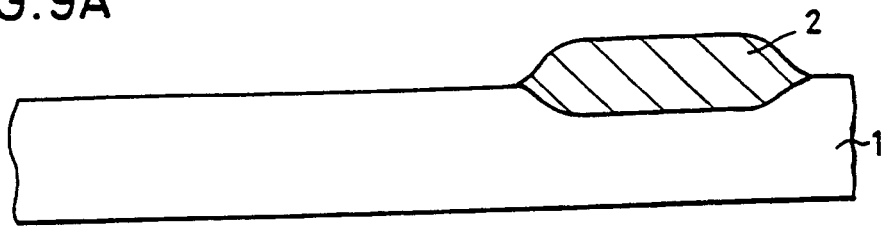
FIGS. 9A, 9B, 9C, 9D, 9E, 9F, 9G, 9H and 9I are sectional views sequentially showing manufacturing process in one embodiment in accordance with the present invention.

FIGS. 9A to 9I are views schematically showing the manufacturing process of DRAM memory cells in the present embodiment. In the present embodiment, an element isolation region 2 for isolating and insulating active regions is formed on the surface of a semiconductor substrate 1 having p type active regions (FIG. 9A).

Figure 9B:
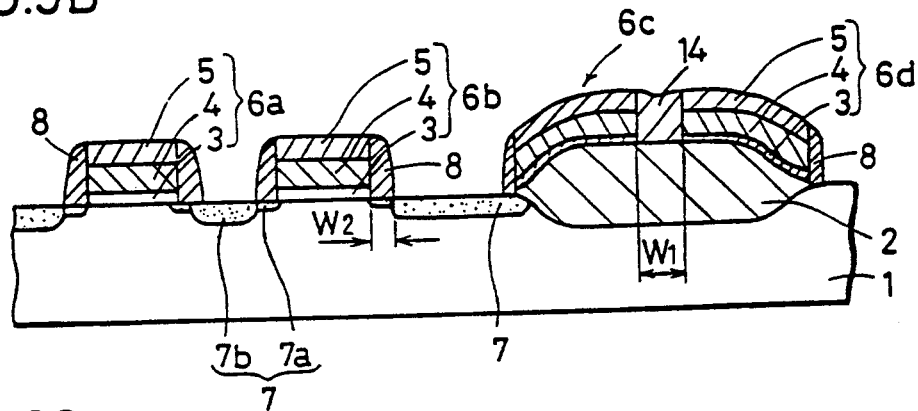

A gate insulating film 3, a polysilicon layer 4 doped with impurities, and an insulating layer 5 are then sequentially formed on the entire surface of the semiconductor substrate 1, and gate electrodes 6a, 6b, 6c and 6d are formed by selectively removing those by photolithography and etching. Then, using the gate electrodes 6a, 6b, 6c and 6d as masks, n type impurity ions such as phosphorus and arsenic are implanted onto the 15 surface of the semiconductor substrate 1 to form a low concentrated n type impurity region 7a. Then, an oxide insulating film is deposited on the entire surface of the semiconductor substrate 1, and anisotropic etching is performed thereon to form an insulating layer 8 on each side wall of the gate electrodes 6a, 6b, 6c and 6d. Then, n type impurity ions such as phosphorus and arsenic are implanted onto the surface of the semiconductor substrate 1, using the gate electrodes 6a, 6b, 6c and 6d and insulating layers 8 as masks to form a highly concentrated n type impurity region 7b, as shown in FIG. 9B. In the process of patterning the gate electrodes 6a, 6b, 6c and 6d, the space $W_l$ between the gate electrodes 6c and 6d shown in FIG. 9B is formed to be smaller than the thickness twice the thickness $W_2$ of the insulating layer 8 formed on each of the side walls of the gate electrodes 6a, 6b in the active region. The space 14 between the gate electrodes 6c and 6d on the element isolation region is approximately buried with the insulating film.

Figure 9C:
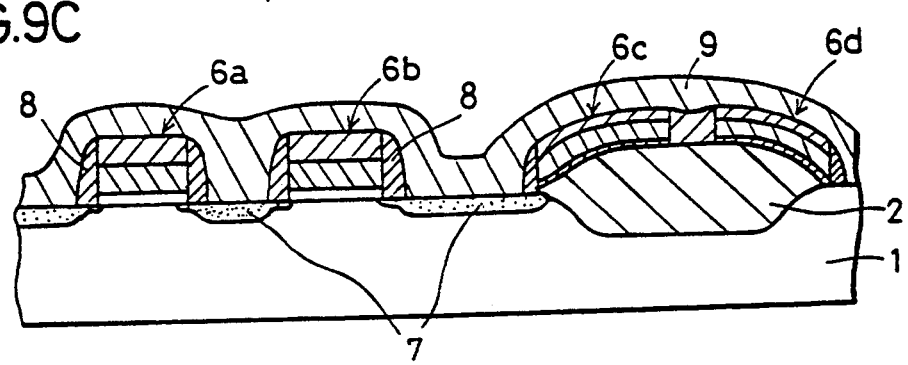
Figure 9D:
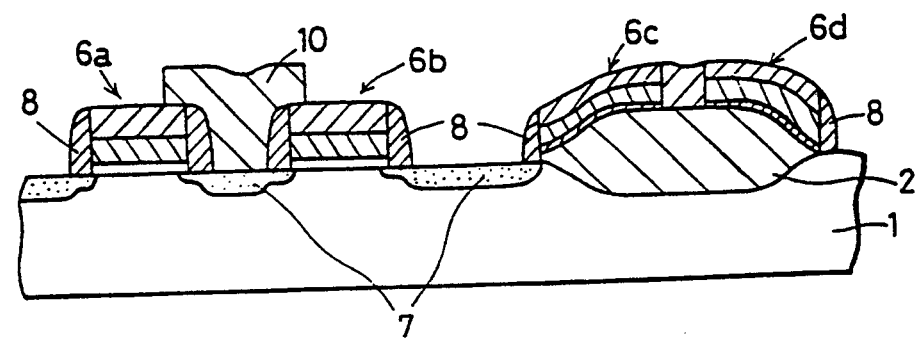

Subsequently, a layer of a high melting point metal 9 such as tungsten, molybdenum, titanium, etc. is deposited on the entire surface of the semiconductor substrate 1 (FIG. 9C). The high melting point metal layer 9 is then patterned into a prescribed form by photolithography and etching, to form a conductive interconnection layer 10 directly contacted by one of source/drain regions 7 (FIG. 9D).

The gate electrodes 6a, 6b, 6c and 6d formed by the above described process constitute the word lines of the DRAM memory cells, the conductive interconnection layer 10 forming the bit lines.

Figure 9E:
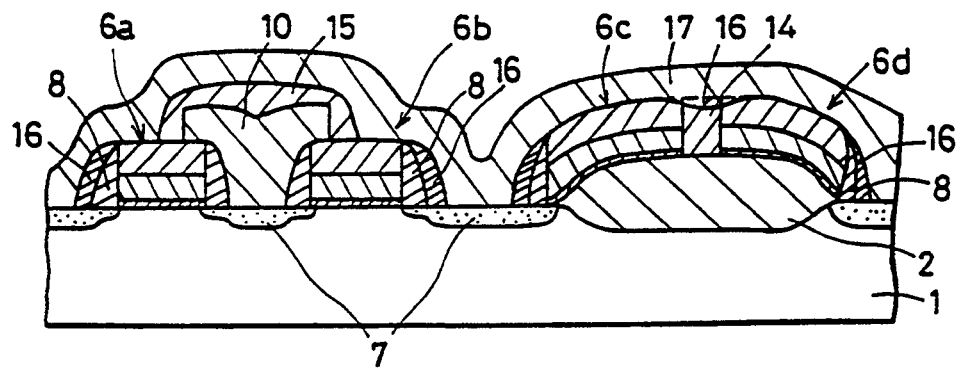

The circumference of the conductive interconnection layer is covered with an insulating layer 15. In the insulating layer 15, the side end of the conductive interconnection layer 10 is formed by anisotropic etching. At the time, an insulating layer 16 is formed also on the exposed surface of the insulating layer 8 formed on the side walls of the gate electrodes 6a, 6b, 6c and 6d. The portion in the space 14 between the gate electrodes 6c, 6d is further flattened in accordance with the formation of the insulating layer 16. After the insulating layers 15 and 16 are formed, a polysilicon layer 17 doped with impurities is deposited on the entire surface of the semiconductor substrate 1 by the CVD method. An impurity having a concentration more than $10^{20}/cm^3$ is injected into the polysilicon layer 17 (FIG. 9E).

Figure 9F:
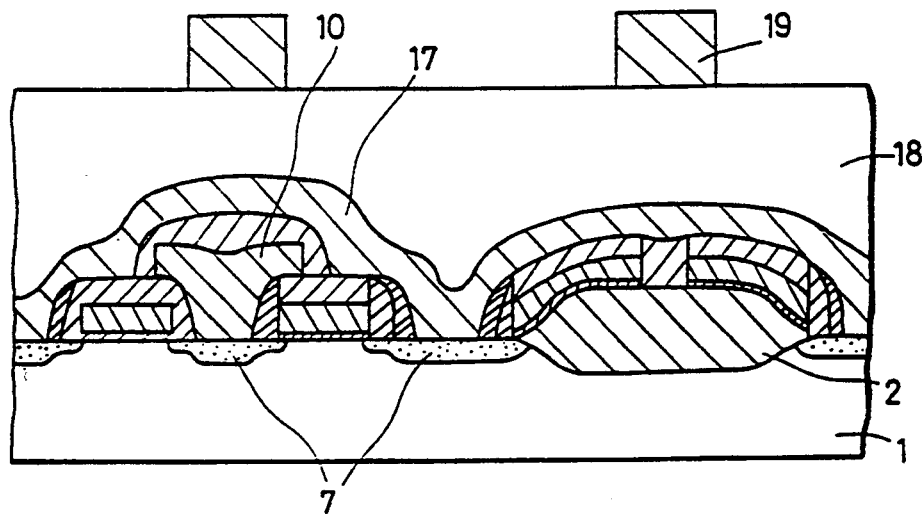
Figure 9G:
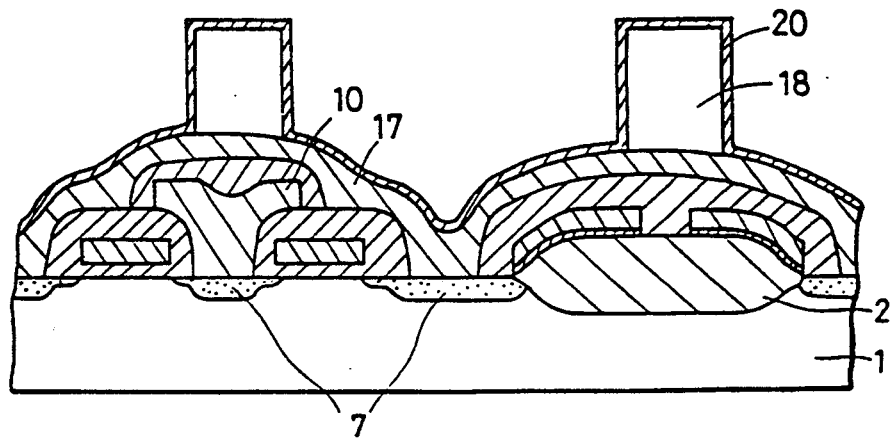

An insulating layer 18 formed of, for example, a silicon oxide film is thickly deposited onto the entire surface of the polysilicon layer 17. Further, a resist mask 19 is patterned into a prescribed form onto the surface of the insulating layer 18 as shown in FIG. 9F, by a lithography method, etc. Subsequently, the insulating layer 18 is removed selectively by, for example, anisotropic etching, and the resist mask 19 is removed, so that a polysilicon layer 20 doped with impurities having a thickness of approximately 500 Å is formed on the entire surface of the semiconductor substrate 1 by the CVD method. It should be noted that impurities having a concentration of $10^{20}/cm^3$ and more are injected into the polysilicon layer 20.

Figure 9H:
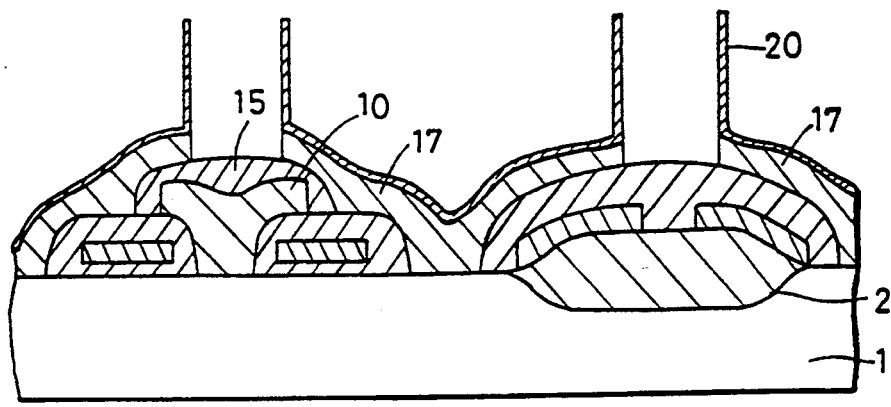
Figure 9I:
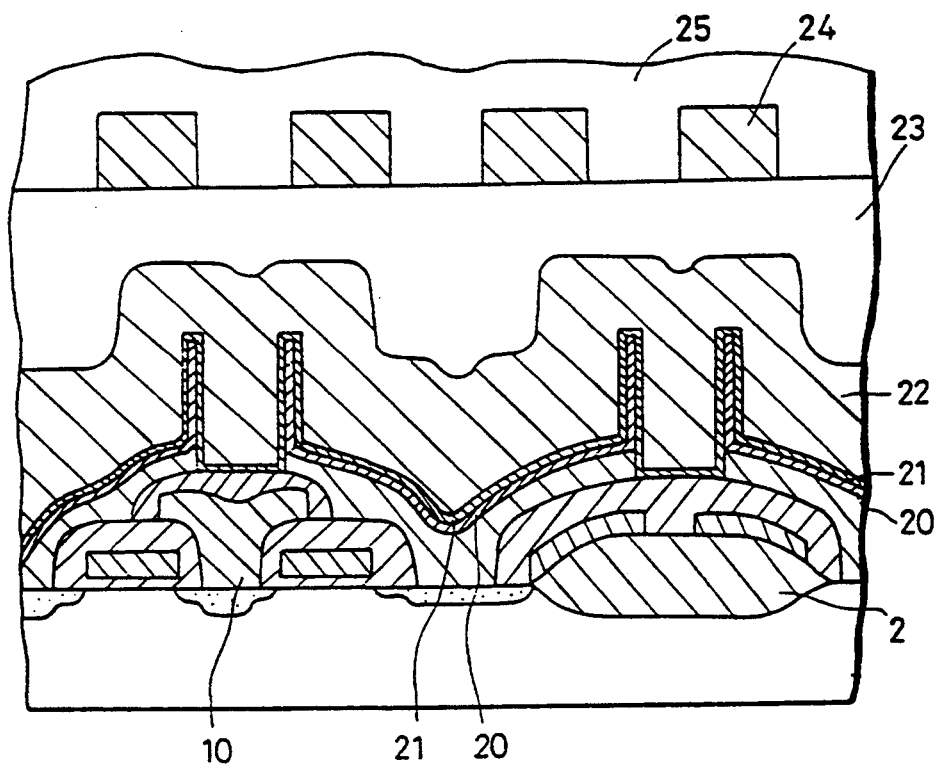

A thick resist (not shown) is applied to cover the surface of the polysilicon layer completely, and the resist is etched back to expose the part of the polysilicon layer 20 covering the upper surface of the insulating layer 18. The exposed polysilicon layer 20 is etched and, then, the insulating layer 18 is etched away in a self aligned manner. The surface of the polysilicon layer 17 is exposed inside an opening produced after the insulating layer 18 is removed by the etching. Further anisotropic etching is applied to remove only the exposed region of the polysilicon 17 in a self aligned manner. FIG. 9H shows the state after the resist is removed.

Entirely over the exposed polysilicon layer 20, a silicon nitride film, a silicon oxide film or a composite film of these films is applied as a dielectric layer 21. Further, entirely over the dielectric layer 21, rosined is an upper electrode (cell plate) 22 such as a conductive polysilicon layer, etc. The cell plate can be made, for example, from a metal having a high melting point. The top of the upper electrode 22 is further covered with a thick interlayer insulating layer 23. A contact hole is formed in a prescribed position of the interlayer insulating layer 23, and a conductor of, for example, polysilicon and tungsten is buried inside the contact hole (not shown). Interconnection layers 24 in a prescribed form formed of aluminum, etc. are formed on the surface of the interlayer insulating layer 23, and the surfaces thereof are covered with a protective film 25, thereby completing a structure shown in FIG. 9I.

Figure 1A:
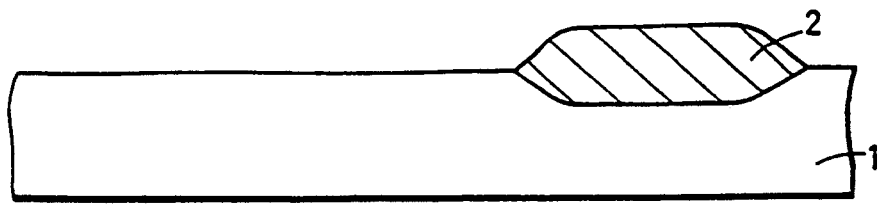
FIGS. 1A, 1B, 1C and 1D are sectional views sequentially showing a part of manufacturing process for conventional DRAM memory cells.
Figure 1B:
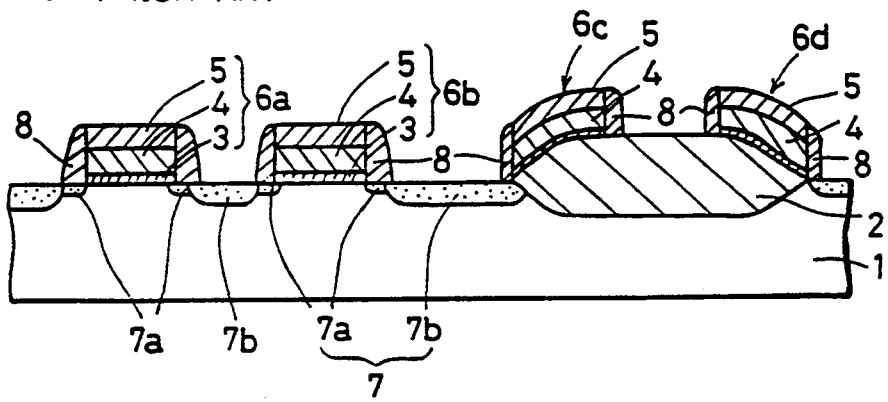
Figure 1C:
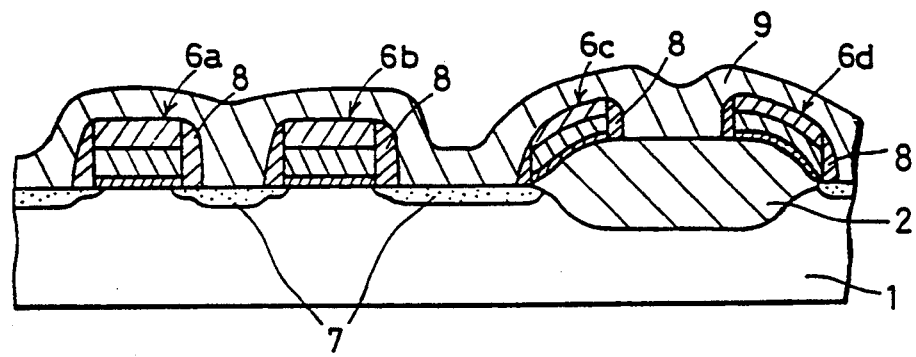
Figure 1D:
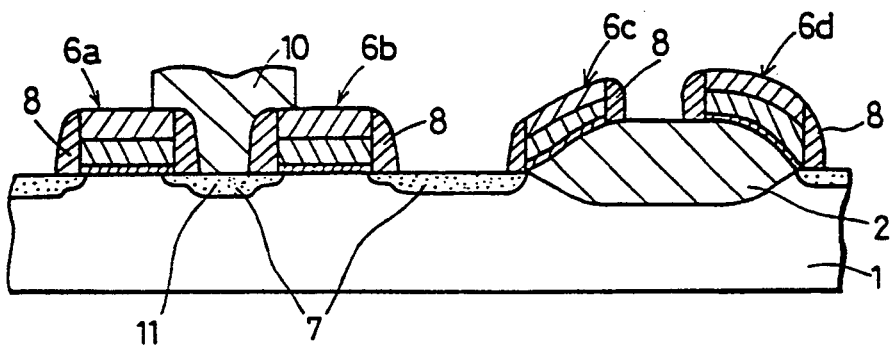
Figure 2:
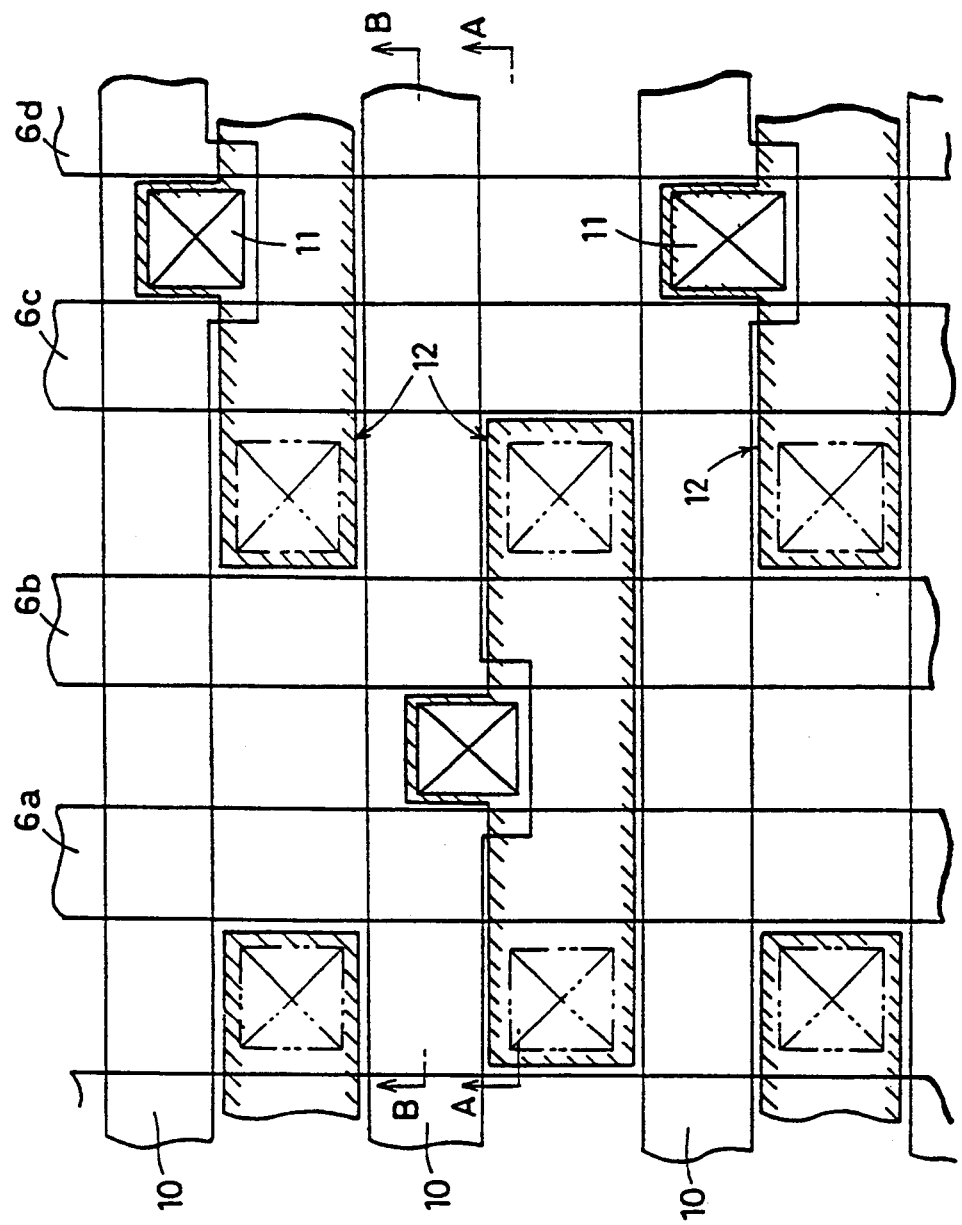
FIG. 2 is a top plan view schematically showing a structure of a DRAM seen from the top.
Figure 3A:
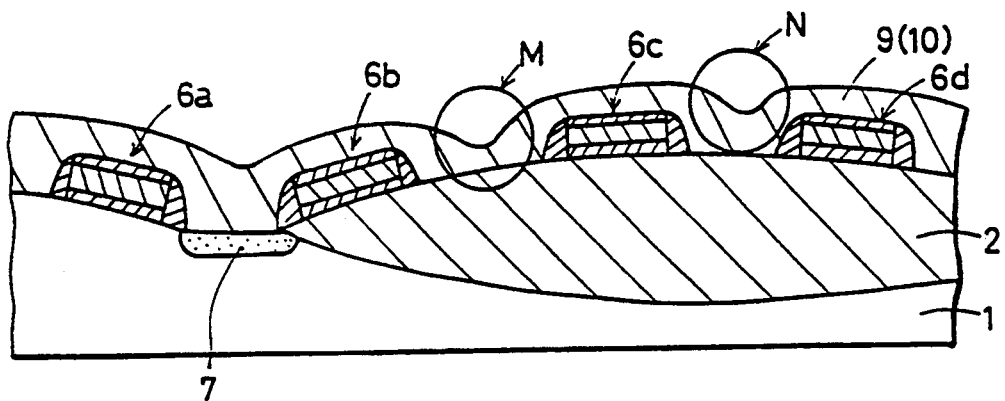
FIGS. 3A, 3B and 3C are sectional views and top plan views of the structure formed in the intermediate stages of the process for describing problems existing in the manufacturing process of the conventional DRAM.
Figure 3B:
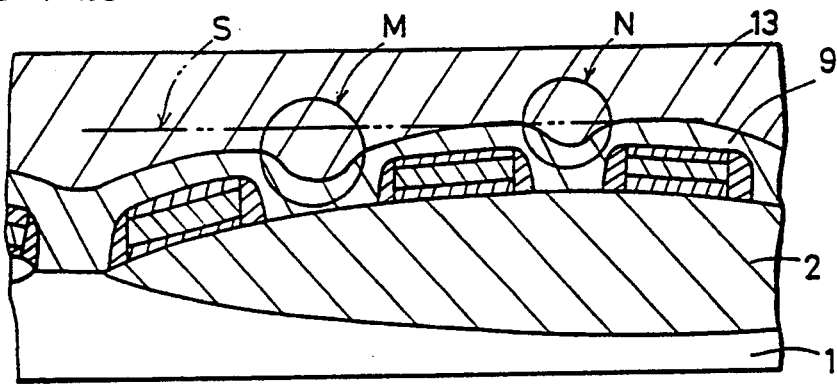
Figure 3C:
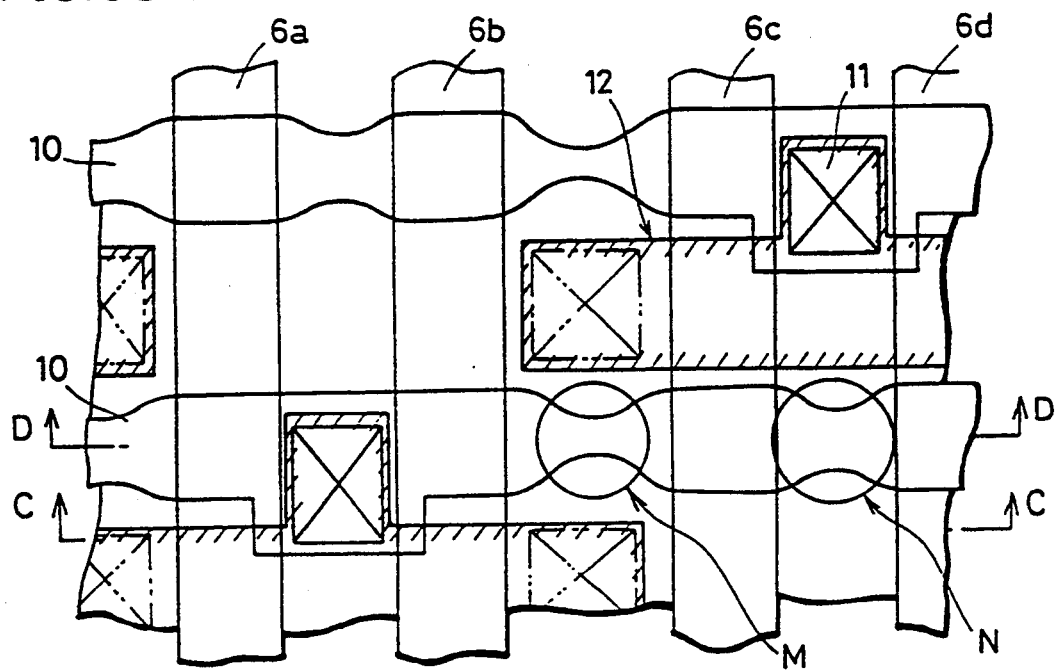
Figure 4A:
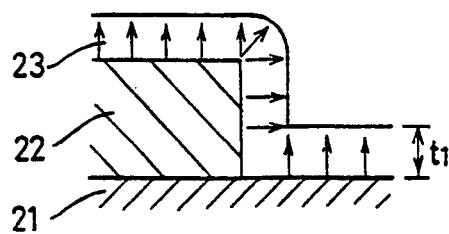
FIG. 4A is a sectional view showing deposition of an oxide film by CVD method.
Figure 4B:
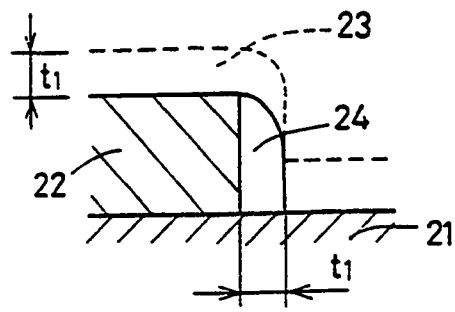
FIG. 4B is a sectional view showing the state in which a side wall spacer is formed by reactive ion etching which is completely anisotropic only in the vertical direction.
Figure 5A:
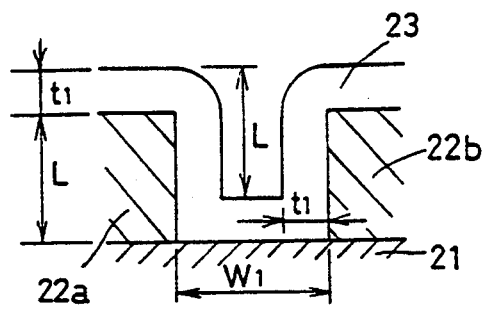
FIGS. 5A, 5B and 5C are sectional views showing deposition of an oxide film to the space between the side walls of two gate electrodes, when $t_1 < W_1/2$, $t_1 = W_1/2$, and $t_1 > W_1/2$, respectively.
Figure 5B:
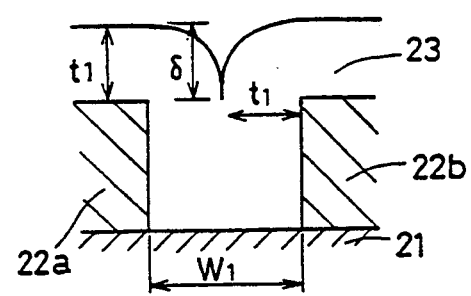
Figure 5C:
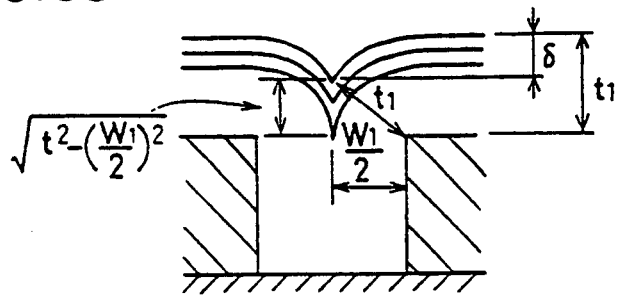
Figure 6:
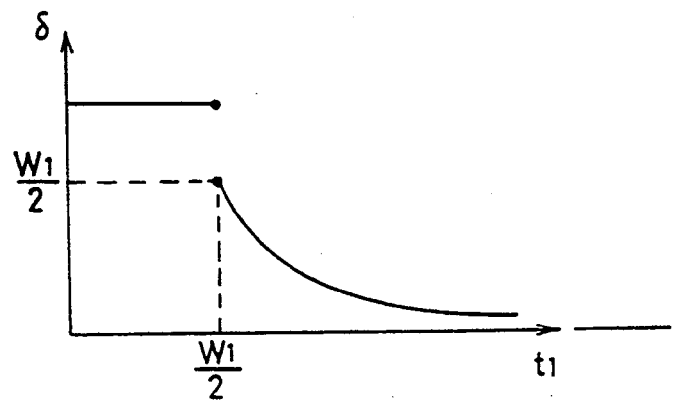
FIG. 6 is a representation graphically showing the relation between the deposition thickness $t_1$ of an oxide film and the depth $\delta$ of a depression.
Figure 7A:
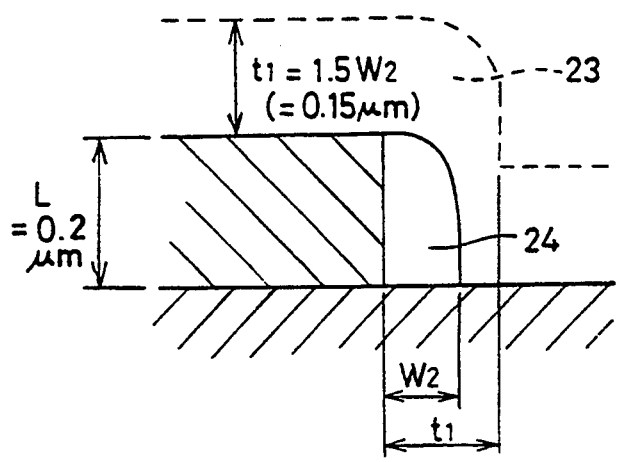
FIG. 7A is a diagram showing the relation between the width $W_2$ of a side wall spacer and the thickness $t_1$ of an oxide film when the side wall spacer is formed by reactive ion etching in practice taking into account of side etching to be caused.
Figure 7B:
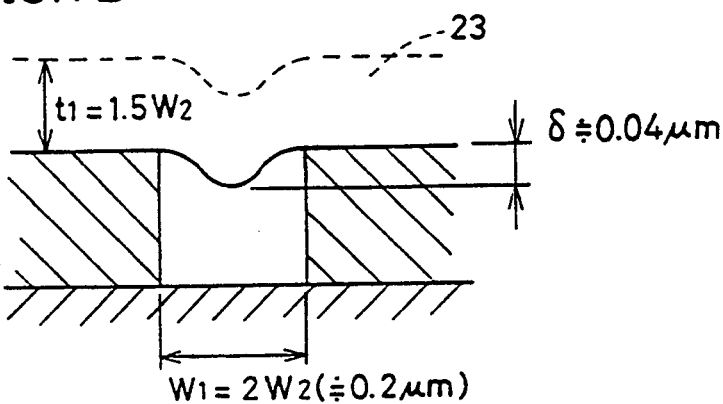
FIG. 7B is a sectional view showing the state after reactive ion etching process in practice when the space between two adjacent gate electrodes $W_1$ equals $2W_1$.
Figure 7C:
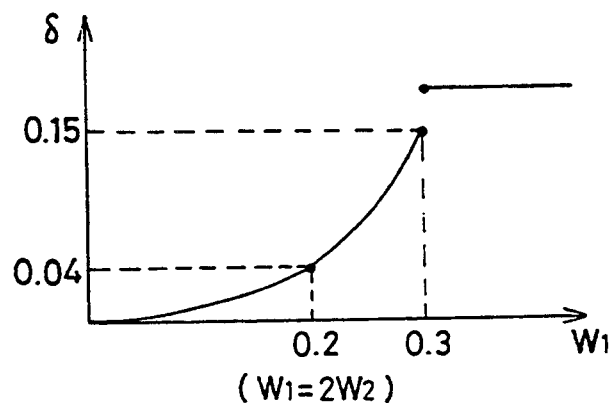
FIG. 7C is a representation graphically showing the relation between $W_1$ and $\delta$ when reactive ion etching in practice is performed.
Figure 8A:
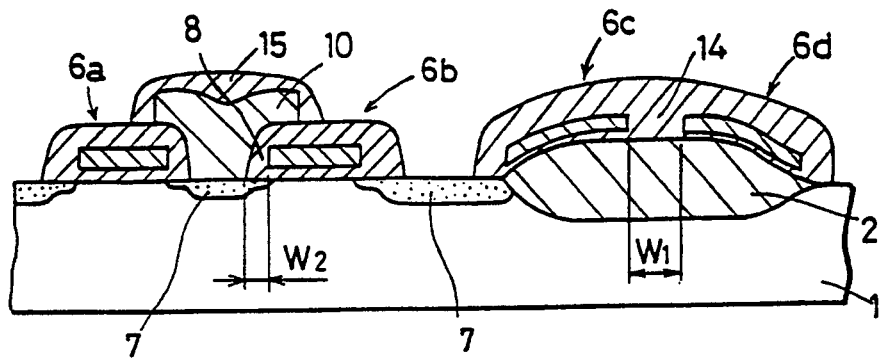
FIGS. 8A, 8B and 8C are sectional views and top plan views showing a structure formed in the intermediate steps of the manufacturing process to clarify the function and effect of one embodiment in accordance with the present invention, FIG. 8C being a top plan view, FIG. 8A being a sectional view taken along C—C in FIG. 8C, FIG. 8B being a sectional view taken along D—D in FIG. 8C.
Figure 8B:
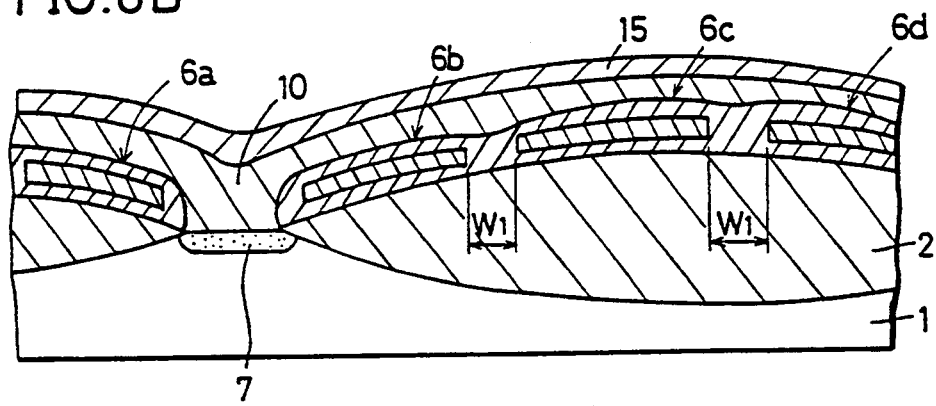
Figure 8C:
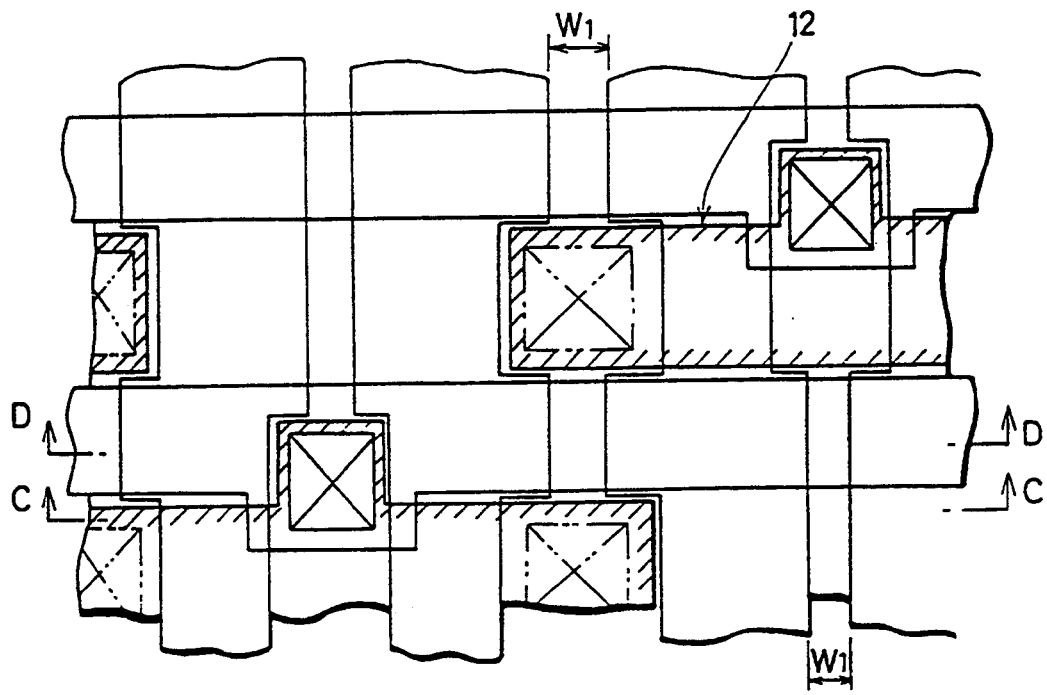

In the above described process in accordance with the present embodiment, the structure after the conductive interconnection layer 10 and the insulating film 15 covering the layer are formed are shown in section in FIGS. 8A and 8B, the top plan view thereof being shown in FIG. 8C. FIG. 8A is a cross section taken along C—C in FIG. 8C, and FIG. 8B is a cross section taken along D—D in FIG. 8C. Inside regions surrounded by oblique lines in the top plan view shown in FIG. 8C are active regions, and regions outside thereof are element isolating regions. Referring to the figures, the gate electrode 6a, 6b, 6c and 6d are patterned so that the width $W_1$ of the space between the opposing side walls of adjacent ones of the gate electrodes 6a, 6b, 6c and 6d in the element isolation region is smaller than twice the width $W_2$ of the insulating layer 8 on the covered side of the conductive interconnection layer in the active region. Accordingly, upon the formation of the insulating layer 8, a major part of the space 14 having the width $W_1$ as shown in FIG. 9B is buried, the depression of the part being decreased, thereby decreasing the unevenness in the underlying part on the element isolation region 2 in forming the conductive interconnection layer 10. The problems as have been observed in the conventional example such as thinning of the conductive interconnection layer 10 and disconnection induced by the unclarity of contrast at the time of photolithography when patterning the conductive interconnection layer 10 are solved.

Further, in the process of forming the insulating layer 15 for covering the circumference of the conductive interconnection layer 10, the upper portion of the space 14 is further flattened.

Among effects obtained from the present embodiment, the following advantages are pointed out, other than the effect in conjunction with the formation of the conductive interconnection layer 10 (bit lines). That is, in the process of the above described embodiment, if the present invention is not applied, i.e., if the spaces between the opposing side walls of adjacent ones among the gate electrodes 6a, 6b, 6c and 6d are the same in thickness in the active region 12 and on the surface of the element isolation region 2, the following problem will arise.

Figure 10A:
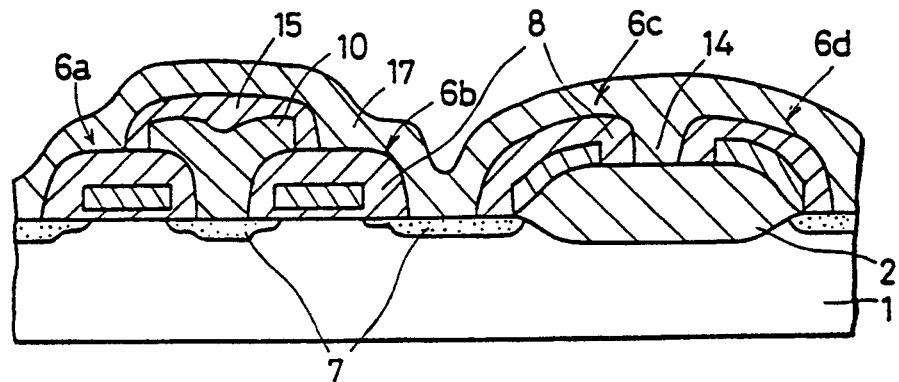
FIGS. 10A, 10B and 10C are sectional view showing a part of the process when the present invention is not applied to the embodiment shown in FIGS. 9A to 9I, FIG. 10A corresponding to FIG. 9E, FIG. 10B corresponding to FIG. 9G, FIG. 10C to FIG. 9H.
Figure 10B:
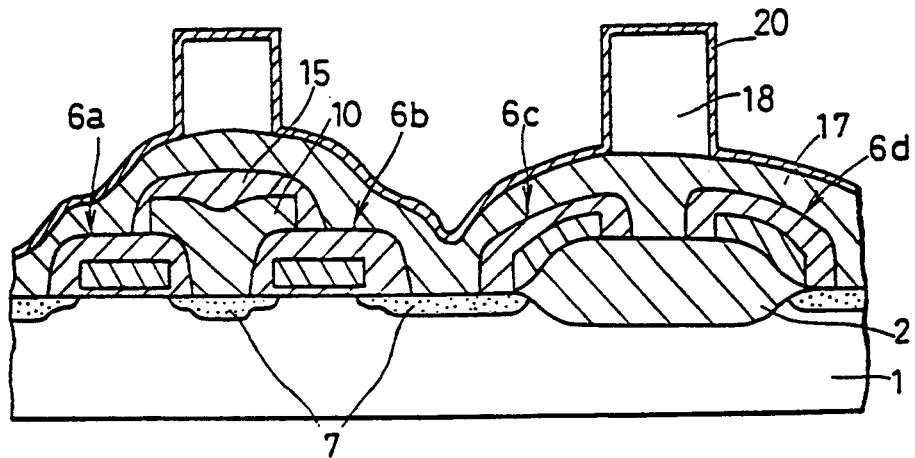
Figure 10C:
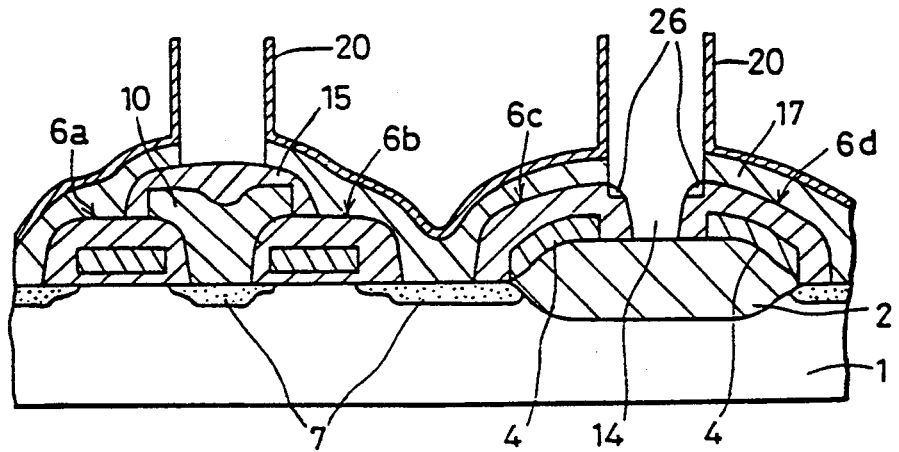

In the above described embodiment, if the space between the opposing side walls of two adjacent ones among the gate electrode 6a, 6b, 6c and 6d is set to be the same on the surface of the active region and on the surface of the element isolation region 2, the manufacturing process will be as shown in FIGS. 10A to 10C. FIGS. 10A, 10B and 10C correspond to FIG. 9E, 9G and 9H in the above described embodiment, respectively. In the process shown in FIGS. 10A to 10C, the space 14 between the opposing side walls of the gate electrodes 6c and 6d on the surface of the element isolation region is not yet buried after the formation of the insulating layer 8 or the insulating layer 15, resulting in a large depression. The space 14 is therefore filled up with polysilicon, upon the formation of the polysilicon layer 17 shown in FIG. 10A. Subsequently, through the following process in FIG. 10B and 10C, a structure corresponding to that of the above described embodiment shown in FIG. 9H is formed. In the self aligned etching process of the insulating layer 18 and the polysilicon layer 17, the polysilicon layer 17 must be completely etched away as far as the bottom of the space 14, i.e. to the surface of the element isolation region 2. This causes a part of the insulating layer 26 which covers the gate electrodes 6c, 6d to be excessively etched, thereby degrading insulation between the upper electrode to be formed (corresponding to the upper electrode 22 in FIG. 9I) and the polysilicon layer 4 of the gate electrodes 6c and 6d. In contrast, the process of the present embodiment shown in FIG. 9A to 9I, the space 14 between the opposing side walls of the gate electrode 6c, 6d on the element isolation region 2 is filled up with insulator and flattened, and, therefore, the etching of the polysilicon layer 17 in a self aligned manner may be performed on the surfaces between the flattened insulating layers. The above described embodiment therefore does not cause any excessive etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device comprising the steps of:

forming an element isolation region on the surface of a semiconductor substrate having active regions of a first conductivity type for isolating and insulating said active regions;

subsequently forming a plurality of gate electrodes arranged substantially parallel to each other on the surface of said semiconductor substrate wherein a top portion of each of said plurality of gate electrodes is covered with an insulating film;

forming first impurity regions having a first impurity concentration in the surface of said semiconductor substrate adjacent and extending beneath said plurality of gate electrodes by implanting impurity ions of a second conductivity type onto the surface of said semiconductor substrate using said gate electrodes as masks;

depositing an insulating film entirely over said semiconductor substrate;

forming insulating layers on the side walls of said gate electrodes by performing anisotropic etching on said insulating film deposited;

forming second impurity regions in the surface of said semiconductor substrate adjacent and extending beneath said insulating layers formed on the side walls of said gate electrodes, said second impurity regions having a second impurity concentration higher than said first impurity concentration and formed by implanting impurity ions of the second conductivity type onto the surface of said semiconductor substrate, using said gate electrodes and said insulating layers as masks; and forming a conductive interconnection layer on said semiconductor substrate formed substantially perpendicularly to said gate electrodes and electrically connected with said highly concentrated impurity regions, wherein in the formation process of said gate electrodes, said gate electrodes are patterned so that spaces between opposing side walls of adjacent ones of said gate electrodes on the element isolation region (2) are smaller than the thickness twice as large as that of said insulating layers to be formed on the side walls of said gate electrodes in the active regions.

2. The manufacturing method of the semiconductor device in accordance with claim 1, wherein said gate electrodes comprise word lines of DRAM memory cells, and said conductive interconnection layer comprises bit lines of the DRAM memory cells.

3. The manufacturing method of the semiconductor device in accordance with claim 1, wherein after the formation of said gate electrode, the thickness of the insulating film to be deposited entirely over said semiconductor substrate is set to be about 1.5 times as large as the thickness of the insulating layers to be formed on the side walls of said gate electrodes in the active regions.

4. The manufacturing method of the semiconductor device in accordance with claim 1, wherein said gate electrodes are patterned by forming sequentially a gate insulating film, a polysilicon layer doped with impurities and an oxide insulating film on the entire surface of the semiconductor substrate and by selectively removing these three layers by photolithography and etching.

5. The manufacturing method of the semiconductor device in accordance with claim 1, wherein the process of forming said conductive interconnection layer is performed by depositing a metal layer entirely over the semiconductor substrate and by removing selectively the metal layer by photolithography and etching.

* * * * *